United States Patent

Yao

(10) Patent No.: US 10,281,342 B2
(45) Date of Patent: May 7, 2019

(54) FARADAY CURRENT AND TEMPERATURE SENSORS

(71) Applicant: Xiaotian Steve Yao, Diamond Bar, CA (US)

(72) Inventor: Xiaotian Steve Yao, Diamond Bar, CA (US)

(73) Assignee: Xiaotian Steve Yao, Huntington Beach, CA (US)

( * ) Notice: Subject to any disclaimer, the term of this patent is extended or adjusted under 35 U.S.C. 154(b) by 0 days.

(21) Appl. No.: 15/677,808

(22) Filed: Aug. 15, 2017

(65) Prior Publication Data

US 2018/0094988 A1 Apr. 5, 2018

Related U.S. Application Data

(63) Continuation of application No. 14/509,015, filed on Oct. 7, 2014, now Pat. No. 9,733,133.

(60) Provisional application No. 61/887,897, filed on Oct. 7, 2013.

(51) Int. Cl.
*G01K 11/32* (2006.01)
*G01R 15/24* (2006.01)
*G01K 11/00* (2006.01)

(52) U.S. Cl.
CPC .............. *G01K 11/32* (2013.01); *G01K 11/00* (2013.01); *G01R 15/246* (2013.01)

(58) Field of Classification Search
CPC ........ G01J 4/00; G01R 19/0092; G01K 11/32
USPC ........................................................ 356/364
See application file for complete search history.

(56) References Cited

U.S. PATENT DOCUMENTS

| 4,563,639 A | * | 1/1986 | Langeac | G01R 15/246 250/227.17 |
| 4,612,500 A | * | 9/1986 | Chen | G01R 19/15 324/105 |
| 4,947,107 A | * | 8/1990 | Doerfler | G01R 15/246 250/227.17 |
| 5,063,290 A | * | 11/1991 | Kersey | G01R 15/246 250/227.17 |

(Continued)

FOREIGN PATENT DOCUMENTS

| CN | 1580789 A | 2/2005 |
| CN | 101403768 A | 4/2009 |

(Continued)

OTHER PUBLICATIONS

Sun, L., et al., "All-Fiber Optical Magnetic Field Sensor Based on Faraday Rotation in Highly Terbium Doped Fiber," Laboratory for Laser Energetics Review, vol. 120, pp. 206-209, Jul.-Sep. 2009.

*Primary Examiner* — Roy M Punnoose
(74) *Attorney, Agent, or Firm* — Perkins Coie LLP

(57) ABSTRACT

Techniques and devices for sensing or measuring electric currents and/or temperature based on photonic sensing is disclosed. An optical current sensor head is located near or at a current-carrying conductor so that a magnetic field associated with the current is present at a Faraday material and the optical detection unit detects the light from the Faraday material to determine a magnitude of the current. An optical temperature sensor head is located near or at a location so that the temperature at a temperature-sensing Faraday material is reflected by the optical polarization rotation which is detected to determine the temperature.

20 Claims, 13 Drawing Sheets

(56) References Cited

U.S. PATENT DOCUMENTS

| | | | | |
|---|---|---|---|---|
| 5,136,235 A | * | 8/1992 | Brandle | G01R 15/246 |
| | | | | 250/227.17 |
| 5,483,347 A | * | 1/1996 | Hollmann | G01B 11/06 |
| | | | | 250/227.11 |
| 5,764,046 A | * | 6/1998 | Bosselmann | G01R 15/246 |
| | | | | 324/96 |
| 5,895,912 A | * | 4/1999 | Bosselmann | G01R 15/247 |
| | | | | 250/227.17 |
| 8,624,579 B2 | * | 1/2014 | Chamorovskiy | G01R 15/246 |
| | | | | 250/227.17 |
| 9,733,133 B2 | * | 8/2017 | Yao | G01K 11/32 |
| 2005/0088662 A1 | | 4/2005 | Bohnert et al. | |
| 2011/0115469 A1 | * | 5/2011 | Kondo | G01R 15/245 |
| | | | | 324/96 |
| 2017/0234912 A1 | * | 8/2017 | Yao | G01K 11/32 |
| | | | | 324/96 |

FOREIGN PATENT DOCUMENTS

| | | |
|---|---|---|
| CN | 102721847 A | 10/2012 |
| WO | 9940446 A1 | 8/1999 |

\* cited by examiner

Illustration of detection with two separated amplifiers.

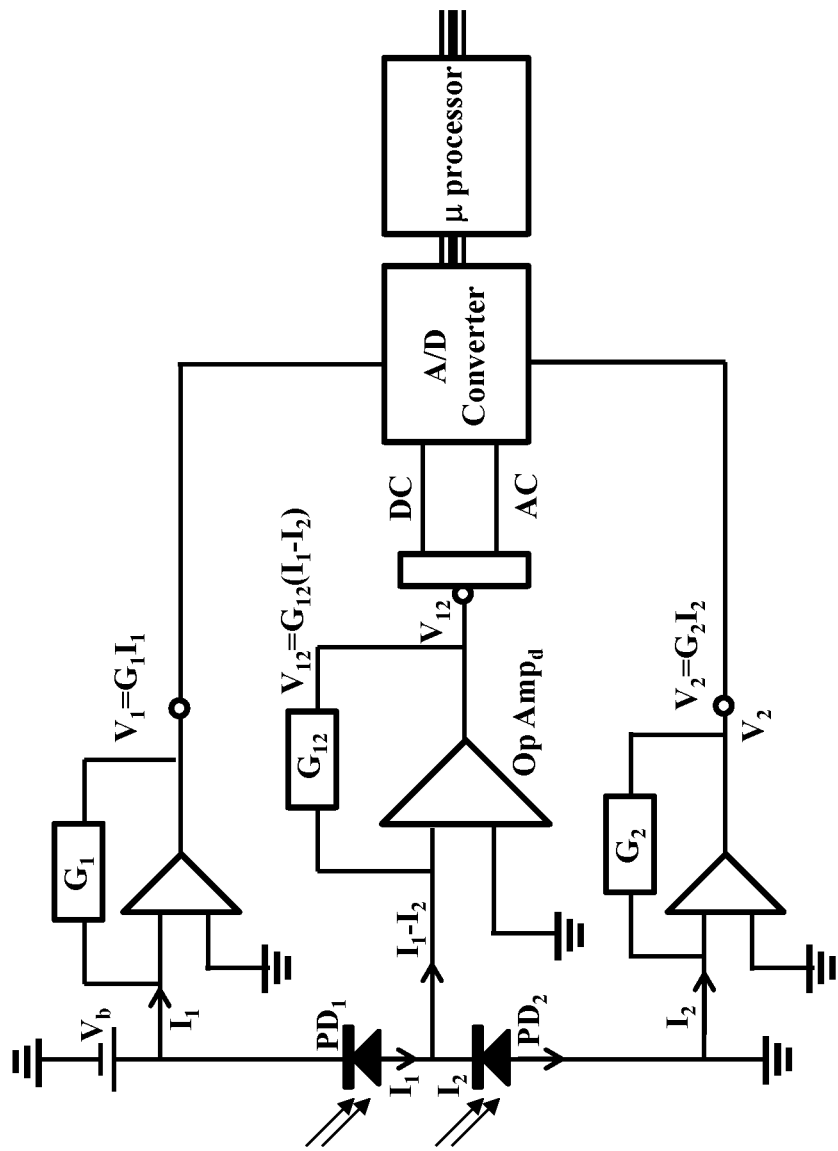
FIG. 3 Illustration of detection with balanced detection circuitry

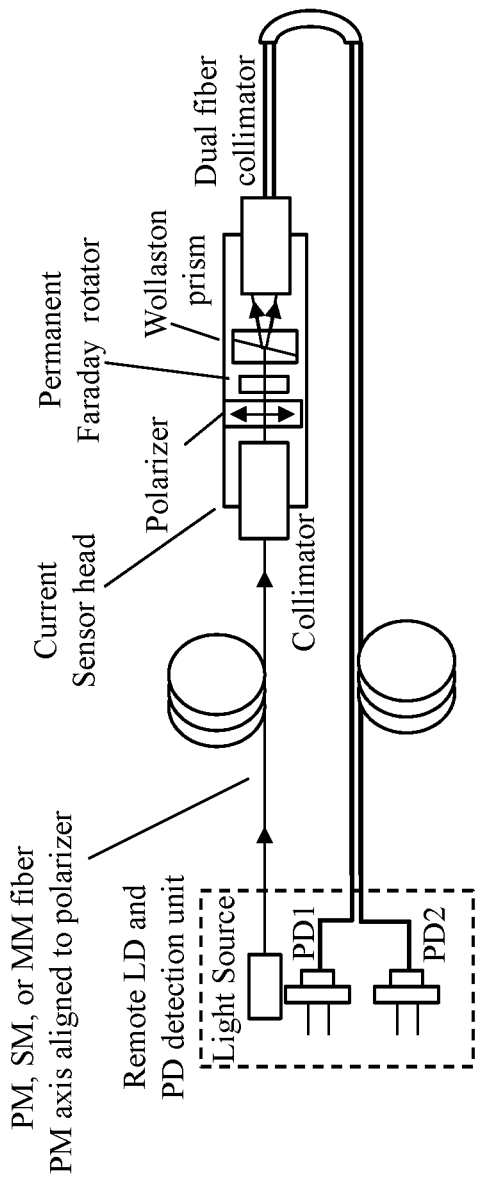
FIG. 4 Illustration of a temperature sensor with the same construction as the current sensor in Fig. 1.

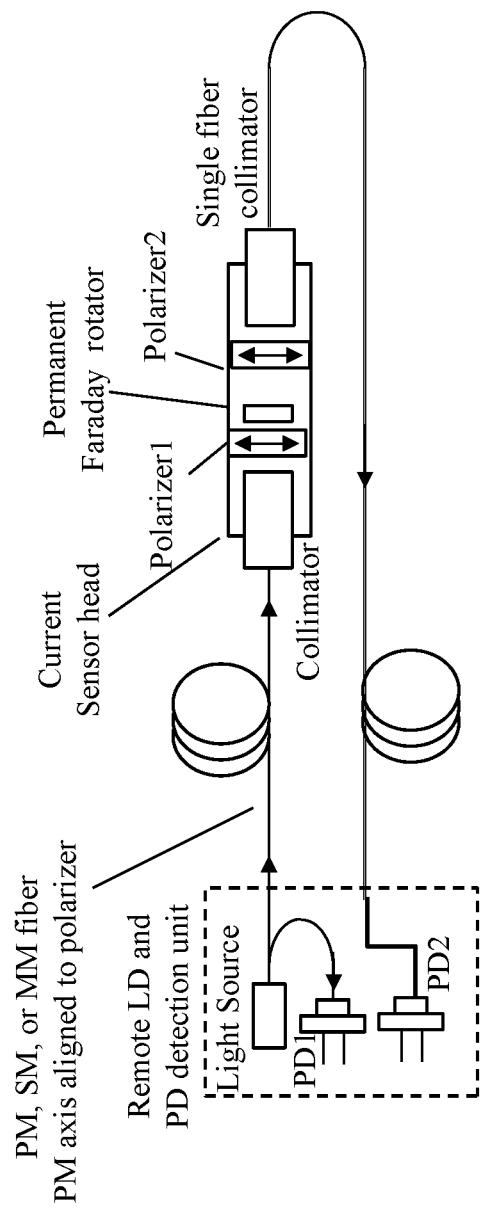
FIG. 5 Illustration of a temperature sensor with a simplified construction compared with that of Fig. 4.

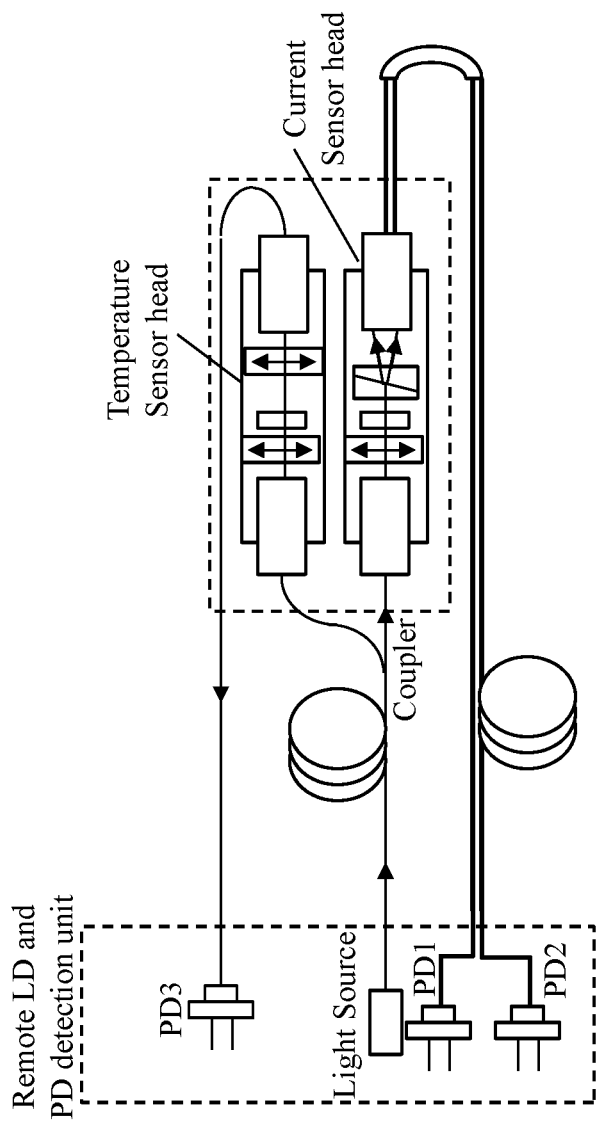
FIG. 6 Illustration of a first embodiment of combining a current sensor head and a temperature sensor head into a same package.

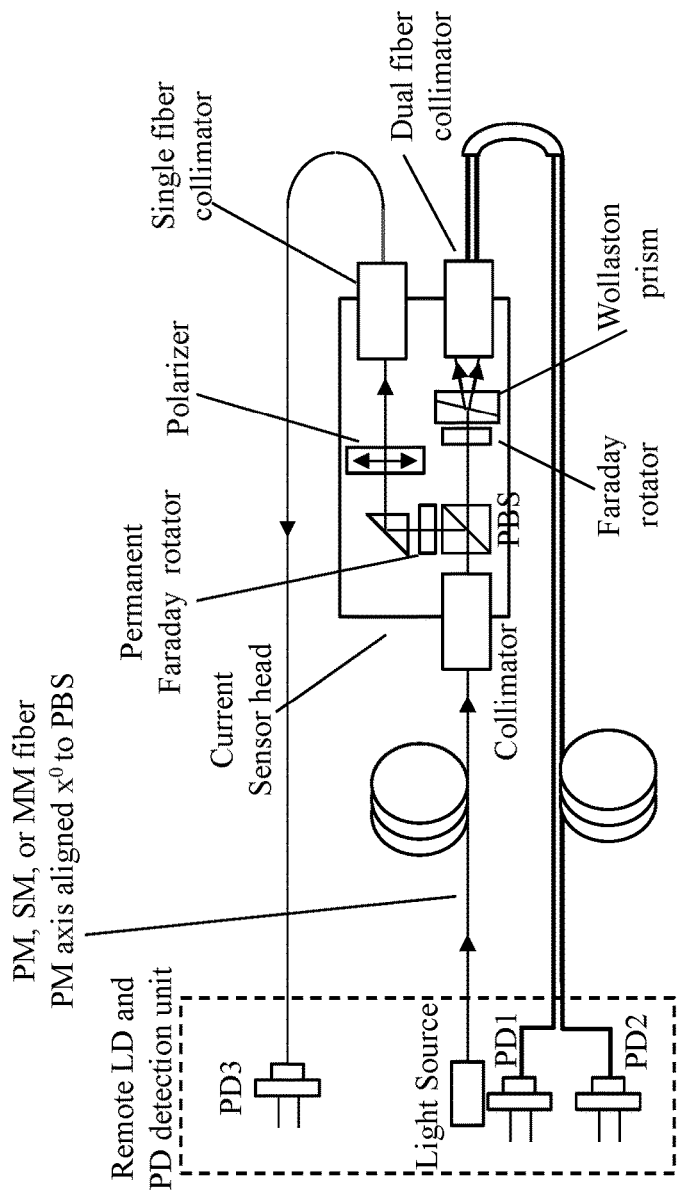
FIG. 7 Illustration of a second embodiment of combining a current sensor head and a temperature sensor head into a same package.

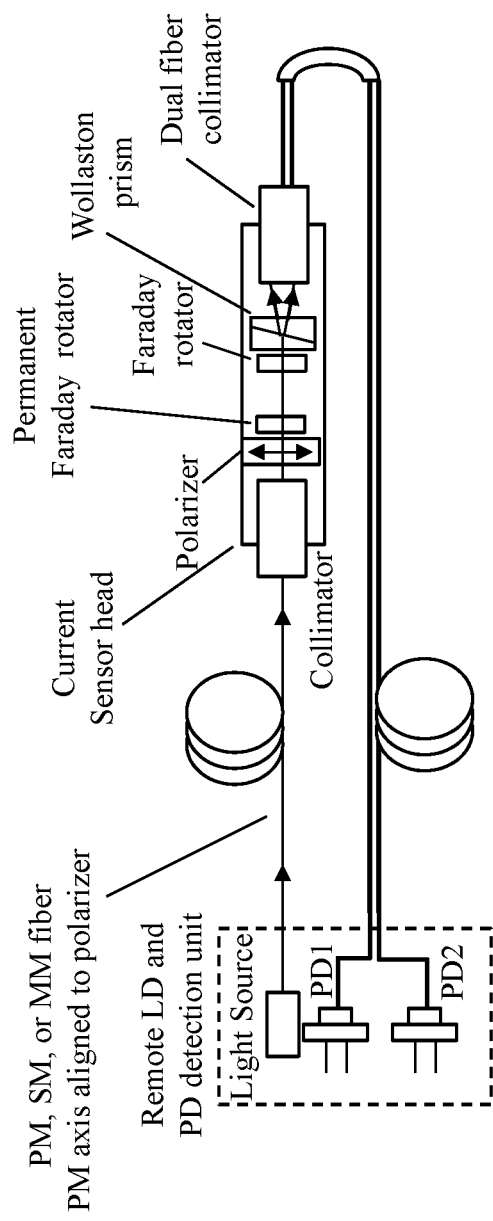
FIG. 8 Illustration of a transmissive current sensor with built-in temperature sensing capability.

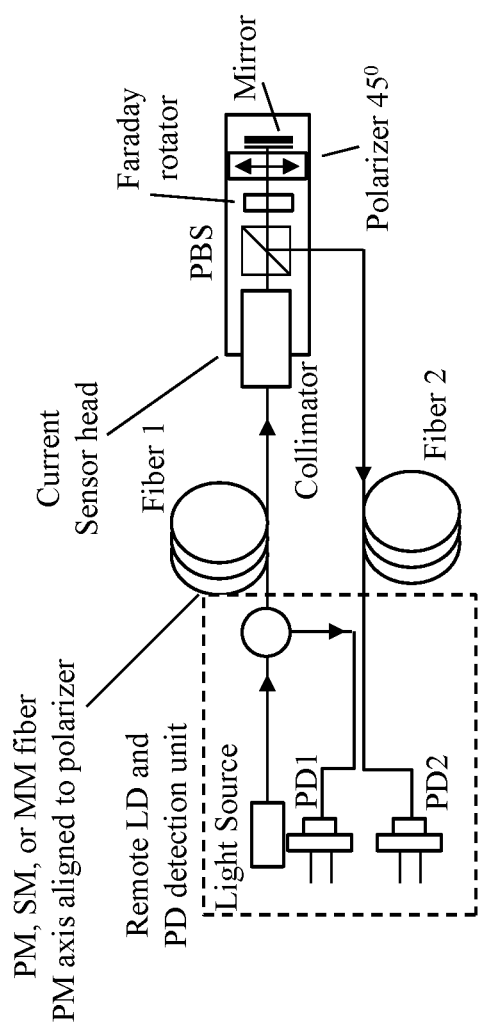
FIG. 9 Illustration of the first embodiment of a reflective current sensor.

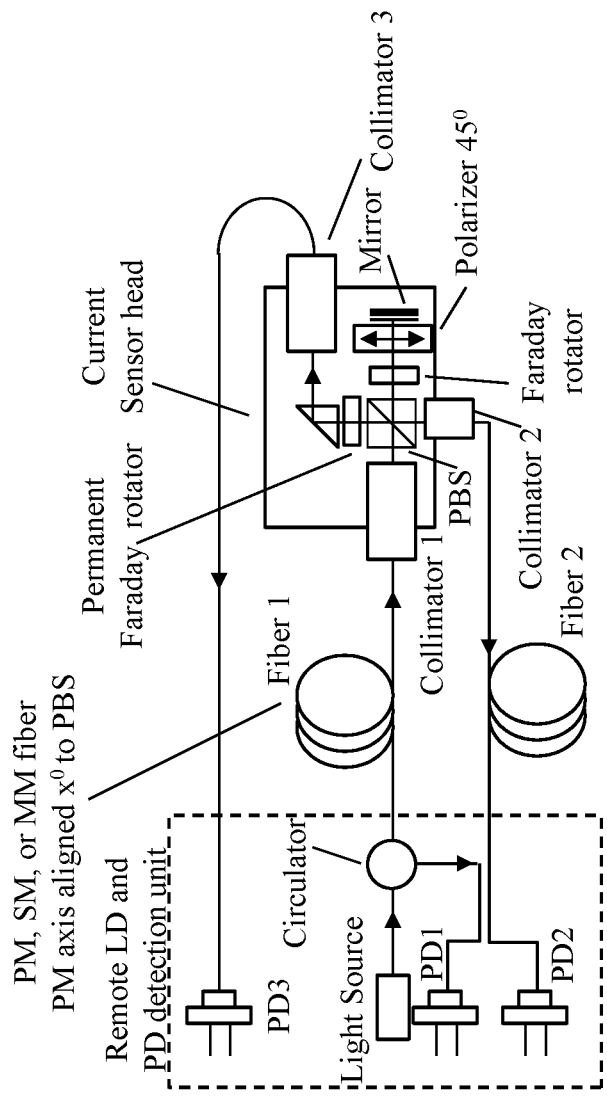
FIG. 10 Illustration of the first embodiment of a reflective current sensor with a build-in temperature sensor.

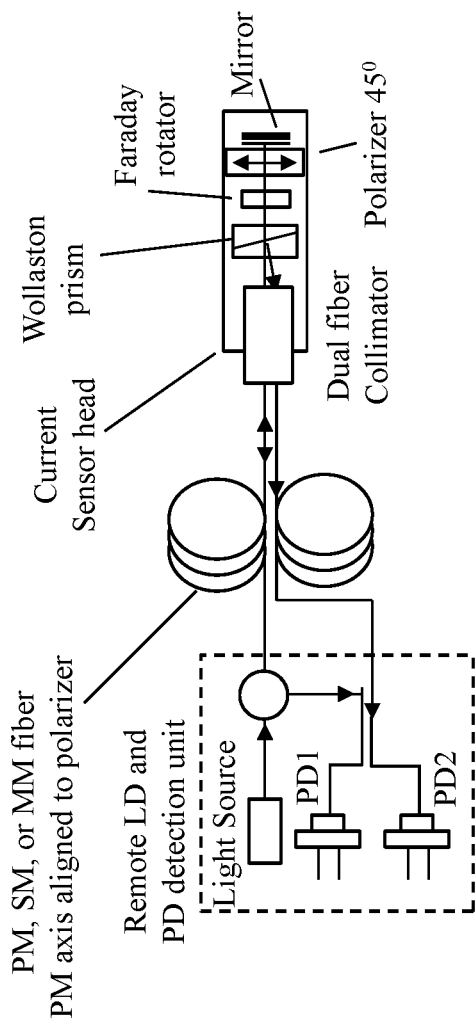
FIG. 11 Illustration of a 3rd embodiment of a reflective current sensor.

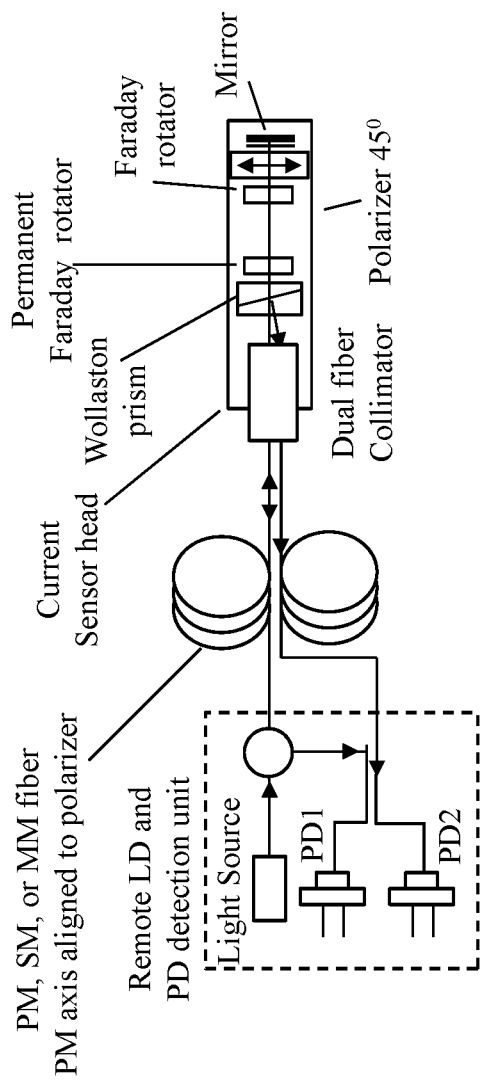
FIG. 12 Illustration of a 4th embodiment of a reflective current sensor.

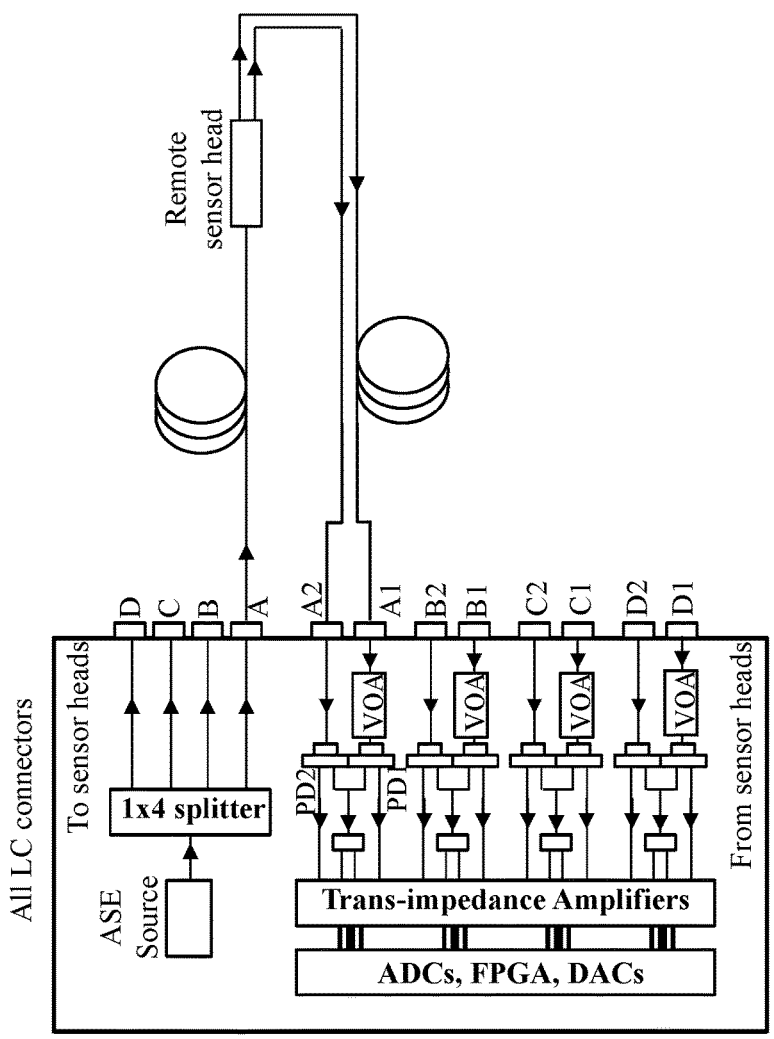
FIG. 13 Illustration of a current sensor monitoring system with 3 current sensing channels and 1 temperature sensing channel.

FARADAY CURRENT AND TEMPERATURE SENSORS

PRIORITY CLAIM AND CROSS REFERENCE TO RELATED APPLICATIONS

This patent document is a continuation of and claims priority to U.S. patent application Ser. No. 14/509,015, filed on Oct. 7, 2014, which claims the benefit of priority of U.S. Provisional Patent Application No. 61/887,897 entitled "COMPACT FARADAY CURRENT SENSOR" and filed on Oct. 7, 2013. The entire content of the before-mentioned patent application is incorporated by reference as part of the disclosure of this document.

TECHNICAL FIELD

This patent application relates to techniques and devices for sensing an electric current and temperature.

BACKGROUND

An electric current is an electrical signal due to flow of charges in an electrically conductive path such as a metal. Given the electrical nature of the electric currents, techniques and devices for sensing or measuring an electric current have been largely based on electronic circuits. Electronic circuits usually require electrical power and can be adversely affected by electromagnetic interference. Various electronic circuits for sensing currents need to be located at the locations where the currents are measured and this may impose practical limitations in various applications.

SUMMARY

This patent application discloses techniques and devices for sensing or measuring electric currents and temperature based on photonic sensing techniques.

In one aspect, a current sensor based on optical sensing is provided to include, a sensor base station including a light source that produces probe light and an optical detection unit; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. This head is configured to include an input optical polarizer to filter the probe light to produce a polarized input beam, a Faraday material located to receive and transmit the polarized input beam as a modified optical beam, and an optical polarization separation device that receives the modified optical beam from the Faraday material and splits the modified optical beam into first and second beams in two different polarizations along first and second optical paths, respectively. This current sensor based on optical sensing further includes a first return fiber line having a first fiber line terminal coupled to the optical current sensor head to receive the first beam and a second fiber line terminal coupled to the optical detection unit of the sensor base station to deliver the first beam from the optical current sensor to the optical detection unit; and a second return fiber line having a first fiber line terminal coupled to the optical current sensor head to receive the second beam and a second fiber line terminal coupled to the optical detection unit of the sensor base station to deliver the second beam from the optical current sensor to the optical detection unit. The optical current sensor head is located near or at a current-carrying conductor so that a magnetic field associated with the current is present at the Faraday material and the optical detection unit detects the two optical beams to determine a magnitude of the current.

In another aspect, a current sensor based on optical sensing is provided to include a sensor base station including a light source that produces probe light and an optical detection unit including a first optical detector that receives a portion of the probe light of the light source to monitor power fluctuations of the light source and a second optical detector that detects light for sensing a current; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. This optical current sensor head is configured to include an input optical polarizer to filter the probe light to produce a polarized input beam, a Faraday material located to receive and transmit the polarized input beam as a modified optical beam, and an output optical polarizer that receives the modified optical beam from the Faraday material and selectively receives a portion of the modified optical beam as an output beam of the optical current sensor head. The current sensor based on optical sensing includes a single return fiber line having a first fiber line terminal coupled to the optical current sensor head to receive output beam and a second fiber line terminal coupled to the optical detection unit of the sensor base station to deliver the output beam from the optical current sensor to the second optical detector inside the optical detection unit. The optical current sensor head is located near or at a current-carrying conductor so that a magnetic field associated with the current is present at the Faraday material and the second optical detector in the optical detection unit detects the output beam to determine a magnitude of the current.

In another aspect, a current sensor based on optical sensing is provided to include a sensor base station including a light source that produces probe light, a first optical detector that receives a portion of the probe light of the light source to monitor power fluctuations of the light source and a second optical detector that detects light for sensing a current; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. The optical current sensor head is configured to include an input optical polarizer to filter the probe light to produce a polarized beam, a polarization beam splitter that selectively outputs a first part of the polarized beam in a first polarization, a Faraday material located to receive and transmit the first part of the polarized beam in the first polarization as a modified optical beam, a polarizer to transmit the modified optical beam and a mirror to reflect the modified optical beam back to the polarizer, the Faraday material and the polarization beam splitter which outputs the reflected modified optical beam as an output beam separated from the probe light received by the optical current sensor head. The current sensor based on optical sensing includes a return fiber line having a first fiber line terminal coupled to the optical current sensor head to receive the output beam to deliver the output beam from the optical current sensor to the second optical detector in the sensor base station. The optical current sensor head is located near or at a current-carrying conductor so that a magnetic field associated with the current is present at the Faraday material and the second optical detector detects the output beam to determine a magnitude of the current.

In another aspect, a temperature sensor based on optical sensing includes a sensor base station including a light source that produces probe light and an optical detection unit that detects light received by sensor base station; an output fiber line having a first fiber line terminal coupled to the sensor base station to receive the probe light from the light source and to direct the received probe light to a second fiber line terminal of the output fiber line away from the sensor base station; an optical temperature sensor head coupled to the second fiber line terminal of the output fiber line to receive the probe light and configured to include an input optical polarizer to filter the probe light to produce a polarized input beam, a Faraday material located to receive and transmit the polarized input beam as a modified optical beam, and an optical polarization separation device that receives the modified optical beam from the Faraday material and splits the modified optical beam into first and second beams in two different polarizations along first and second optical paths, respectively; a first return fiber line having a first fiber line terminal coupled to the optical temperature sensor head to receive the first beam and a second fiber line terminal coupled to the optical detection unit of the sensor base station to deliver the first beam from the optical temperature sensor to the optical detection unit; and a second return fiber line having a first fiber line terminal coupled to the optical temperature sensor head to receive the second beam and a second fiber line terminal coupled to the optical detection unit of the sensor base station to deliver the second beam from the optical temperature sensor to the optical detection unit. The Faraday material in the optical temperature sensor head causes a rotation of polarization of light based on a temperature at the Faraday material and the optical detection unit measures the two optical beams to determine the temperature.

In yet another aspect, a temperature sensor based on optical sensing includes a sensor base station including a light source that produces probe light and an optical detection unit including a first optical detector that receives a portion of the probe light of the light source to monitor power fluctuations of the light source and a second optical detector that detects light received by the sensor base station; an output fiber line having a first fiber line terminal coupled to the sensor base station to receive the probe light from the light source and to direct the received probe light to a second fiber line terminal of the output fiber line away from the sensor base station; an optical temperature sensor head coupled to the second fiber line terminal of the output fiber line to receive the probe light and configured to include an input optical polarizer to filter the probe light to produce a polarized input beam, a Faraday material located to receive and transmit the polarized input beam as a modified optical beam, and an output optical polarizer that receives the modified optical beam from the Faraday material and selectively receives a portion of the modified optical beam as an output beam of the optical current sensor head; and a single return fiber line having a first fiber line terminal coupled to the optical temperature sensor head to receive output beam and a second fiber line terminal coupled to the optical detection unit of the sensor base station to deliver the output beam from the optical current sensor to the second optical detector inside the optical detection unit. The Faraday material in the optical temperature sensor head causes a rotation of polarization of light based on a temperature at the Faraday material and the optical detection unit detects the output beam to measure the temperature. In implementations, the optical temperature sensor is configured to magnetically shield the Faraday material from an external magnetic field.

The above and other aspects and their implementations and examples are described in greater detail in the drawings, the description and the claims.

BRIEF DESCRIPTION OF THE DRAWINGS

FIG. 3 shows another example of an optical detection circuit in a balanced detection design to detect the differential power levels from the two output fibers in order to significantly increase the detection sensitivity or the dynamic range of the current sensor system in FIG. 1.

FIG. 4 shows an example of a temperature sensor with the same construction as the current sensor in FIG. 1, where the variable Faraday rotator in FIG. 1 is replaced with the permanent Faraday rotator of x degrees, which is magnetically shielded to prevent the influence of the current to be sensed.

FIG. 5 shows an example of a simpler embodiment of the temperature sensor based on the permanent Faraday rotator, in which the Wollaston prism in FIG. 4 is replaced with a polarizer (polarizer 2) and the dual fiber collimator is replaced with a single fiber collimator.

FIG. 6 illustrates an example of a first embodiment of combining a current sensor head and a temperature sensor head into a same package.

FIG. 7 illustrates an example of a second embodiment of combining a current sensor head and a temperature sensor head into a same package.

FIG. 8 shows an example of a transmissive current sensor with built-in temperature sensing capability, where a permanent Faraday rotator with an x degree rotation as in FIGS. 6 and 7 is placed in front of the sensing Faraday rotator.

FIG. 9 shows an example of a first embodiment of a reflective current sensor head, in which the polarizer is oriented 45 degrees from the PBS passing axis so that the reflected light from the mirror is split 50% by the PBS into two separate fibers at zero magnetic field.

FIGS. 10, 11 and 12 show examples of a reflective current sensor head with an integrated temperature sensing capability.

FIG. 13 shows an example of a current sensing system for simultaneously monitoring currents in three conductors in a 3-phase power system.

DETAILED DESCRIPTION

Figure 1:
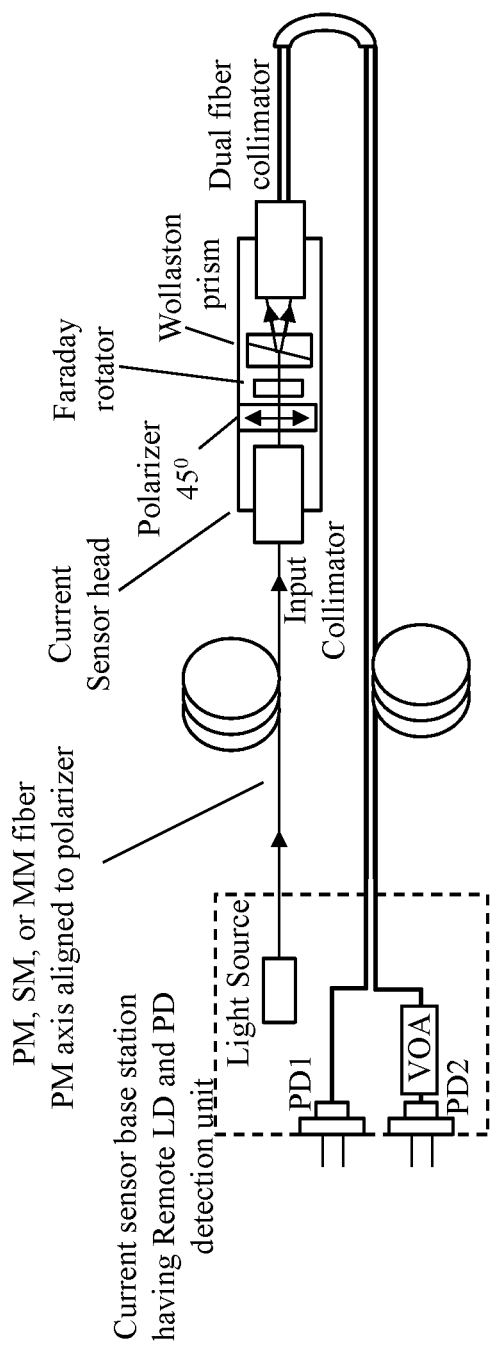
FIG. 1 shows an example of a first design of a current sensing system based on the disclosed technology showing a transmissive current sensor having a current sensor base station and a remote current sensor head. A Wollaston prism is used to separate the two orthogonal polarization components into two separate fibers. The polarizer is oriented 45 degrees from the Wollaston prism to allow 50% splitting when no magnetic field applied. A balanced detector in FIG. 2 can be used to receive the detected optical power. A variable optical attenuator is used to ensure that the photocurrent in the two PDs are equal.

Sensing of an electric current based on a fiber optic current sensor is attractive for monitoring, control, and protection of substations and power distribution systems in smart grid. Comparing with some existing current sensors, they have the advantage of being able to separate the sensor head and electronic processing unit at different locations, and therefore do not require any electrical power at the sensor head, making it safe for high voltage applications. Implementations of fiber optic current sensors can be configured to achieve other advantages, including small size, light weight, immune to electromagnetic interferences, low power consumption, immunity to current saturation or others. Fiber coil based current sensors using Faraday effect in the fiber have been widely used for high-voltage applications where the fiber coil winds around the current-carrying conductor. Such fiber coil based current sensors are generally more expensive and require breaking an electrical cable to install. Fiber current sensors based on Faraday glasses or crystals have the advantages of compact size, light weight, low cost, and easy installation, compared with their fiber coil based counterparts. In particular, they can directly mount on the current conducting cable even with life current flow, and can significantly reduce the installation cost. Because of the low cost and small size, they can be applied to low and medium voltage applications for transformer monitoring, and therefore have a much larger market potential.

Accuracy, dynamic range, and environmental stability are the main performance indicators for the fiber optic current sensors. An effective way to increase the dynamic range is to increase the magnetic field detection sensitivity, requiring significantly reducing the noise in optoelectronics detection circuitry. The temperature dependence of the Verdet constants of the Faraday glasses or crystals poses challenges for the for the measurement accuracy and need to be addressed in the sensor systems design. The temperature effect on the optical signal derived from the sensor head can impact the environmentally stable operation of the sensor, and thus it is advantageous to provide a mechanism for compensating for the temperature effect. In addition, interferences of the magnetic fields from the neighboring current carrying conductors can also affect the current detection accuracy, and thus should be reduced or minimized.

This patent document discloses examples of constructions for increasing the circuit detection sensitivity, measuring the temperature of the sensor head, compensating the temperature effects of the sensor head, and eliminate the interferences from the neighboring conductors for achieving a current sensor system with high accuracy, large dynamic range, and high environmental stability.

In some implementations, a current sensor based optical sensing disclosed herein includes a sensor base station including a light source that produces probe light and an optical detection unit, and an optical current sensor head for sensing the current. The optical current sensor is located away from the current sensor base station and is free of electronics. The current sensor includes an output fiber line having a first fiber line terminal coupled to the sensor base station to receive the probe light from the light source and to direct the received probe light to a second fiber line terminal of the output fiber line away from the sensor base station. The optical current sensor head is coupled to the second fiber line terminal of the output fiber line to receive the probe light. The optical current sensor is configured to include an input optical polarizer to filter the probe light to produce a polarized input beam, a Faraday material located to receive and transmit the polarized input beam as a modified optical beam, and an optical polarization separation device that receives the modified optical beam from the Faraday material and splits the modified optical beam into first and second beams in two different polarizations along first and second optical paths, respectively. Included in the current sensor are a first return fiber line having a first fiber line terminal coupled to the optical current sensor head to receive the first beam and a second fiber line terminal coupled to the optical detection unit of the sensor base station to deliver the first beam from the optical current sensor to the optical detection unit; and a second return fiber line having a first fiber line terminal coupled to the optical current sensor head to receive the second beam and a second fiber line terminal coupled to the optical detection unit of the sensor base station to deliver the second beam from the optical current sensor to the optical detection unit. The optical current sensor head is located near or at a current-carrying conductor so that a magnetic field associated with the current is present at the Faraday material and the optical detection unit detects the two optical beams to determine a magnitude of the current.

FIG. 1 shows an example of a first design of a current sensing system. A broad bandwidth light source with a low degree of polarization (DOP), such as an amplified spontaneous emission (ASE) light source or a superluminescent light emitting diode (SLED) light source, is used as the light source to produce the probe light for sensing the current. This use of a light source with a low degree of polarization and a broadband width can be beneficial in various ways. The broad bandwidth light source is included along with a photodiode (PD) detection unit in a current sensor base station which is linked via fiber to a current sensor head that is located at a different location away from the current sensor base station having the light source and the photodiode detection unit. The current sensor head is an all optical current sensor head formed by optical components without local electronic circuits or components. In this regard, the sensor head does not include any optical detector and directs light carrying the measurement information of the current to the current sensor base station via a fiber link. The all-optical current sensor head is placed by the current-carrying conductor to sense the current based on the optical polarization rotation caused by the magnetic field associated with the current in the Faraday material inside the all-optical current sensor. When the current to be measured is perpendicular to the light propagation path of the Faraday rotator, the magnetic field produced by the current is along the light propagation path of the Faraday rotator and thus exerts most influence to the polarization rotation of the light. The probe light from the broad bandwidth light source is directed to the current sensor head and a returned light beam is directed back from the current sensor head back to the photodiode (PD) detection unit within the current sensor base station via fiber and is detected to extract information on the electric current sensed by the current sensor head. The low DOP property of the probe light is to assure the optical power stability passing through the sensor head if single mode fiber (SMF) or multimode fiber (MMF) is used to deliver light into the sensor head located remotely at the current sensing site. If a more expensive polarization maintaining (PM) fiber is used, a light source with high DOP can be used and the polarization axis of the probe light is aligned with the slow (or fast) axis of the PM fiber.

The current sensor head includes an optical polarizer to receive the probe light from the light source, a Faraday rotator to receive the output light from the optical polarizer, and an optical polarization separation unit that separates two light beams of two orthogonal polarizations in the light from the Faraday rotator. The probe light first passes through the polarizer to define the input polarization to the current sensor head. An input optical collimator may be used to collimate the light to be directed into the optical polarizer. In an implementation using a low DOP source, there is no requirement of the orientation of the polarizer with respect to the input light. On the other hand, in an implementation based on a PM fiber, the polarizer's passing axis should be aligned to the slow (or fast) axis of the PM fiber. After the polarizer, the linearly polarized light passes through a Faraday material as the Faraday rotator, such as a length of glass, a length of Faraday crystal, or piece of Faraday film capable of rotating the polarization of light in response to a magnetic field parallel to the Faraday material. The optical polarization separation unit that receives output light from the Faraday rotator can be implemented in various configurations. For example, in FIG. 1, a micro Wollaston prism is used as such an optical polarization separation unit to separate the input linear polarization into two orthogonal polarization components propagating at a small crossing angle, e.g., about 3.7 degrees. The orientation of the optical polarization direction of the Wollaston prism can be set to be 45 degrees from the polarizer's passing axis such that when there is no magnetic field present, the two orthogonal polarization components have equal powers (50% splitting). A dual fiber collimator with a crossing angle similar to that of the Wollaston prism is then used to focus the two polarization components into two separate output fibers. The two output fibers can be either single mode (SM) fiber or multimode (MM) fiber to transmit the light back to the current sensor base station.

The current sensor base station which houses the light source in the example in FIG. 1 is coupled to the two output fibers to receive the light from the two fibers in the two polarizations and contains optical sensing unit that detects and converts the received optical signal sin two polarizations into two detector signals to be processed by a signal processing unit that is remotely located from the current sensor head. Two optical detectors, PD1 and PD2, can be included within the current sensor base station to detect the returned light in the two fibers from the current sensor head, respectively. An optical attenuator, such as a voltage controlled optical attenuator (VOA), may be used to control the relative amplitudes of light received at PD1 and PD2 so that the optical power levels of received light in the two fibers are equal when there is no magnetic field present at the remote current sensor head.

The above example in FIG. 1 provides a particular structural design of a current sensor based on optical sensing. This current sensor design includes a sensor base station including a light source that produces probe light and an optical detection unit; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. The head is configured to include an input optical polarizer to filter the probe light to produce a polarized input beam, a Faraday material located to receive and transmit the polarized input beam as a modified optical beam, and an optical polarization separation device that receives the modified optical beam from the Faraday material and splits the modified optical beam into first and second beams in two different polarizations along first and second optical paths, respectively. In addition, this current sensor based on optical sensing further includes a first return fiber line having a first fiber line terminal coupled to the optical current sensor head to receive the first beam and a second fiber line terminal coupled to the optical detection unit of the sensor base station to deliver the first beam from the optical current sensor to the optical detection unit; and a second return fiber line having a first fiber line terminal coupled to the optical current sensor head to receive the second beam and a second fiber line terminal coupled to the optical detection unit of the sensor base station to deliver the second beam from the optical current sensor to the optical detection unit. The optical current sensor head is located near or at a current-carrying conductor so that a magnetic field associated with the current is present at the Faraday material and the optical detection unit detects the two optical beams to determine a magnitude of the current.

In implementations, it is desirable to achieve high detection sensitivity to provide sensitive and accurate measurements of the current. The two optical detectors can be electrically coupled to one another in a balanced detection configuration to reduce noise and to enhance the detection sensitivity.

Figure 2:
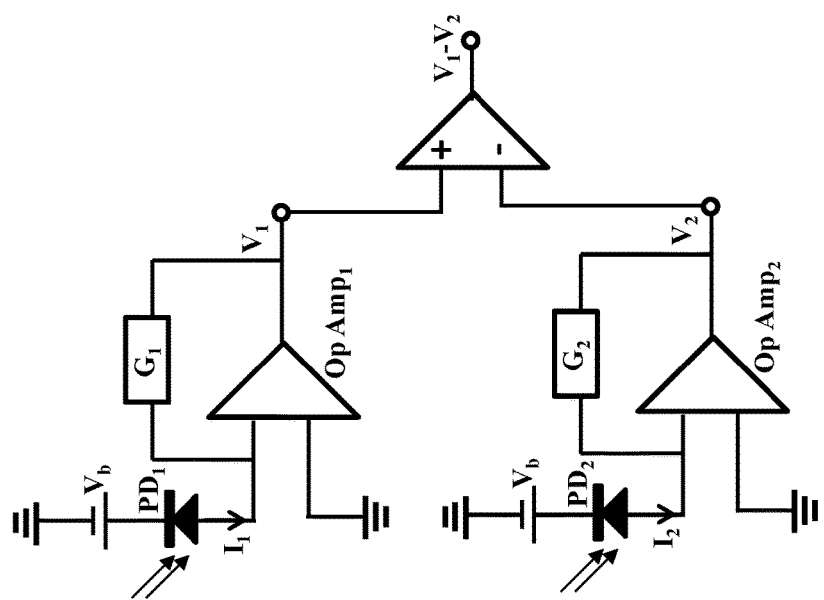
FIG. 2 shows an example of an optical detection circuit using two separate photodetectors to detect the optical power levels from the two output fibers in FIG. 1.

FIG. 2 shows an example of an optical detection circuit using two separate photodetectors PD1 and PD2 to detect the optical powers from the two output fibers.

FIG. 3 shows an example of an optical detection circuit in a balanced detection design to detect the differential power levels from the two output fibers in order to significantly increase the detection sensitivity or the dynamic range of the current sensor system. The use of low DOP light is an important aspect in this implementation. If the light source has a high DOP, an optical depolarizer can be placed in the optical path between the light source and the optical sensing head and is used to convert the light with a high DOP into light with a sufficiently low DOP, e.g., less than 10%. The use of the balanced detection can achieve high detection sensitivity.

The electric field of the optical beam after the input polarizer can be written as:

$$\vec{E}_{in} = E_0 \hat{y}, \quad (1)$$

where $\hat{y}$ is the passing axis of the input polarizer. After passing through the Faraday rotator with a rotation angle of θ, the electric field becomes:

$$\vec{E}_F = E_0(\cos\theta \hat{y} + \sin\theta \hat{x}) \quad (2)$$

The two principle axes of the Wollaston prism can be represented as:

$$\hat{w}_1 = \frac{1}{\sqrt{2}}(\hat{y}+\hat{x}),\ \hat{w}_2 = \frac{1}{\sqrt{2}}(\hat{y}-\hat{x}) \quad (3)$$

where a relative orientation of 45 degree between the input polarizer and the Wollaston prism is assumed. The powers of the two polarization components in the two output fibers are therefore:

$$P_1 = \alpha_1 |\vec{E}_F \cdot \hat{w}_1|^2 = \frac{\alpha_1 E_0^2}{2}(1+\sin 2\theta), \quad (4)$$

$$P_2 = \alpha_2 |\vec{E}_F \cdot \hat{w}_2|^2 = \frac{\alpha_2 E_0^2}{2}(1-\sin 2\theta) \quad (5)$$

where $\alpha_1$ and $\alpha_2$ are the optical losses caused by the coupling and imperfections of the optical parts. The photocurrent received by the two PDs are therefore:

$$I_1 = \frac{\rho_1 \alpha_1 E_0^2}{2}(1 + \sin 2\theta) = I_{10}(1 + \sin 2\theta) \quad (6)$$

$$I_2 = \frac{\rho_1 \alpha_2 E_0^2}{2}(1 - \sin 2\theta) = I_{20}(1 - \sin 2\theta), \quad (7)$$

where $\rho_1$ and $\rho_2$ are responsivities of PD1 and PD2 respectively, and $I_{10}$ and $I_{20}$ are the nominal photocurrent in PD1 and PD2 respectively.

If the signals from the two PDs are separately amplified, as in FIG. 2, the gains of the two amplifiers may be adjusted or set to obtain:

$$V_1 = V_0(1+\sin 2\theta) \quad (8)$$

$$V_2 = V_0(1-\sin 2\theta), \quad (9)$$

where $V_0 = \rho_1 \alpha_1 G_1 E_0^2/2 = \rho_2 \alpha_2 G_2 E_0^2/2$, and $G_1$ and $G_2$ are the trans-impedance gains of PD1 and PD2, respectively.

$$\sin 2\theta = \frac{V_1 - V_2}{V_1 + V_2} \quad (10)$$

The power fluctuations of the light source can be eliminated with the double outputs.

In some of the prior art current sensors designs, only a single photodetector is used and the corresponding photovoltage can still be expressed in Eq. (8). Because the conductor current is AC with a frequency of 50 or 60 Hz, Eq. (8) can be separated into DC and AC components: $V_{DC} = V_0$ and $V_{AC} = V_0 \sin 2\theta$. The Faraday rotation angle can be obtained by $\sin 2\theta = V_{AC}/V_{DC}$. In practical circuits, the AC and DC components of a signal can easily be separated using a bias tee or high-pass and low-pass filters.

The optical attenuation or the electrical circuits may be controlled such that $\rho_1 \alpha_1 = \rho_2 \alpha_2 = \rho\alpha$ to obtain:

$$I_1 = I_0(1+\sin 2\theta) \quad (11)$$

$$I_2 = I_0(1-\sin 2\theta) \quad (12)$$

where $I_0 = \rho\alpha E_0^2/2$. Using the balanced detection circuitry as in FIG. 3, the relation between the differential photo current and the Faraday rotation angle can be represented by:

$$\sin 2\theta = \frac{(I_1 - I_2)}{(I_1 + I_2)} \quad (13)$$

Although Eq. (10) for FIG. 2 and Eq. (13) for FIG. 3 may look similar, the circuitry of FIG. 3 has much better detection sensitivity and dynamic range than the circuitry of FIG. 2.

In general, the current induced rotation angle can be expressed as:

$$\theta(j,T) = \theta_0(T) + V_d(T) \cdot j(t) \cdot L = \theta_0(T) + j(t) \quad (14)$$

where $\theta_0(T)$ is a rotation bias, j(t) is the electrical current in the conductor and $\beta(T) = V_d(T)L$, with $V_d(T)$ and L being the Verdet constant (temperature sensitive) and the length of the Faraday material respectively. In power generation and distribution systems, the conductor current is generally AC with a frequency of 50 or 60 Hz, and can be expressed as:

$$j(t) = j_{dc} + j_{ac} \sin(\omega t + \phi_0) \quad (15)$$

where $j_{dc}$ is the residual DC component of the current, $j_{ac}$, $\omega$, and $\phi_0$ are the amplitude, angular frequency and the phase of the AC component of the current in the conductor, respectively. When the power station is normal, the DC component should be close to zero. However, when the power station operates abnormally, DC component will be non-zero.

$$\theta(I,T) = \gamma(T) + \beta(T)j_{ac} \sin(\omega t + \phi_0) \quad (16)$$

where $$\gamma(T) = \theta_0(T) + \beta(T)j_{dc} \quad (17)$$

is the DC term of the rotation angle. Eq. (15) can be substituted in Eq. (11) and Eq. (12) to obtain the following:

$$I_1(t) = I_0\{1 + \sin 2[\gamma(T) + \beta(T)j_{ac}\sin(\omega t + \phi_0)]\} \quad (18)$$

$$I_2(t) = I_0\{1 - \sin 2[\gamma(T) + \beta(T)j_{ac}\sin(\omega t + \phi_0)]\} \quad (19)$$

$$\Delta I_{12}(t) = I_1(t) - I_2(t) = 2I_0 \sin 2[\gamma(T) + \beta(T)j_{ac}\sin(\omega t + \phi_0)] \quad (20a)$$

$$\Delta I_{12}(t) \approx 4I_0 \beta(T)j_{ac}\sin(\omega t + \phi_0) \quad (20b)$$

$$j(t) = j_{ac}\sin(\omega t + \phi_0) \approx \frac{\Delta I_{12}(t)}{4[I_1(t) + I_2(t)]LV_d(T)} \quad (20c)$$

In Eq. (20b) and (20c), $\beta(T)j_{ac} \ll 1$ and $\gamma(T) = 0$ are assumed. Eq. (18) and Eq. (19) can be expanded using Bassel functions:

$$\Delta I_{12}(t) = 2I_0 \left\{ \sin 2\gamma J_0(2\beta j_{ac}) + \cos 2\gamma \sum_1^\infty J_{2m-1}(2\beta j_{ac}) \sin[(2m-1)(\omega t + \phi_0)] + \sin 2\gamma \sum_1^\infty J_{2m}(2\beta j_{ac}) \cos[2m(\omega t + \phi_0)] \right\} \quad (21)$$

For the DC term:

$$\Delta I_{12}(DC) = 2I_0 \sin 2\gamma J_0(2\beta j_{ac}) \quad (22)$$

For the $\omega$ term:

$$\Delta I_{12}(\omega) = 2I_0 \cos 2\gamma J_1(2\beta j_{ac}) \quad (23)$$

For the 2$\omega$ term:

$$\Delta I_{12}(2\omega) = 2I_0 \sin 2\gamma J_2(2\beta j_{ac}) \quad (24)$$

For the n$\omega$ term:

$$\Delta I_{12}(n\omega) = 2I_0 \sin 2\gamma J_n(2\beta j_{ac}), n \text{ is even} \quad (25a)$$

$$\Delta I_{12}(n(n\omega)) = 2I_0 \cos 2\gamma J_n(2\beta j_{ac}), n \text{ is odd} \quad (25b)$$

The output from the balanced detector of FIG. 3 can be separated into a DC and AC parts. The DC part is represented by Eq. (32) and the Fourier components of the AC parts are represented by Eqs. (23), (24), and (25), and they can be obtained by taking FFT of the AC part of the signal after A/D converter. The digital filtering of each Fourier component can be used to increase the signal to noise ratio. Referring to FIG. 3, $\Delta I_{12}(t)$, $I_1(t)$, and $I_2(t)$ can be obtained by:

$$\Delta I_{12}(t) = V_{12}/G_{12} \quad (26)$$

$$I_1(t) = V_1/G_1 \quad (27)$$

$$I_2(t) = V_2/G_2, \quad (28)$$

where $G_{12}$, $G_1$, and $G_2$ are the trans-impedance gains of the operation amplifiers for the three photocurrents, respectively.

$$I_0 = I_1(t) + I_2(t) \tag{29}$$

The peak detection of the AC part of the differential signal $\Delta I_{12}$ (t) can be used to obtain the maximum current in the conductor from Eq. (20b):

$$j_{ac} \approx \Delta I_{12}(\text{peak})/(4I_0\beta), \tag{30}$$

where $\gamma \ll 1$ and $\beta j_{ac} \ll 1$ are assumed in Eq. (20).

Such a peak current detection is fast (instantaneous) but with a less accuracy. The result can be used for circuit protection purpose. For, signal processing by using the Fourier components can be used to achieve high accuracy measurements.

In an ideal case, $\gamma=0$ (no DC component in the conductor current and no rotation angle bias), $\Delta I_{12}$ ($\omega$) and $I_0$ can be determined by using Eq. (23) and Eq. (29), and the value of $\beta(T) j_{ac}$ can be determined by using a look up table. In the case of malfunctioning, the DC component may not be zero and the relative relationship among harmonic components of the differential current can change. In this case, Eq. (23) can be used to obtain $\beta(T) j_{ac}$ by assuming $\gamma=0$. The value of $\gamma$ can be obtained by substituting $\beta(T) j_{ac}$ into Eq. (22). The obtained $\gamma$ can be put into Eq. (23) to obtain more accurate $\beta(T) j_{ac}$, and a more accurate measurement of $\gamma$ can be obtained using Eq. (22). The above process can be repeated until both $\gamma$ and $\beta(T) j_{ac}$ converge.

In implementations, both $\gamma$ and $\beta(T)$ may be temperature dependent and the accuracy of the final obtained current amplitudes $j_{ac}$ and $j_{dc}$ are affected by the temperature change. One way to solve the problem is to find a way to measure the temperature at the sensor and find the accurate value of $\beta(T)$ and $\gamma$ at the corresponding temperature. For this purpose, the precise temperature dependences of $\gamma$ and $\beta(T)$ can be determined with a calibration procedure by using the fiber optic sensor to measure a known current (measured with a standard current measurement instrument) at different temperature settings and obtain measurements of curves of $\beta(T)$ vs. T and $\gamma$ vs. T. The linear fit of the curves can yield the temperature coefficients of both $\gamma$ and $\beta(T)$. In obtaining the temperature dependence of $\gamma$, $j_{dc}$ is assumed to be zero. Only the rotation angle bias $\theta_0$ (T) is considered.

The optical sensing for measuring currents in FIG. 1 can be configured to for measuring temperature. FIGS. 4 and 5 show two examples of such a temperature sensor.

FIG. 4 discloses a temperature sensor with the same construction as the current sensor in FIG. 1, where the variable Faraday rotator in FIG. 1 is replaced with the permanent Faraday rotator of a particular amount of polarization rotation at a rotation angle of some specific degrees. The permanent Faraday rotator includes a transparent Faraday material and a magnetic structure to produce a magnetic field along the propagation path of the light in the transparent Faraday material. The permanent Faraday rotator is magnetically shielded from influence of any external magnetic field, preventing the influence of the magnetic field from a current such as the current to be sensed. The polarization rotation angle produced by the Faraday material varies with the temperature of the material and this dependence of the rotation with the temperature, when the material is free of an external magnetic field along the light propagation direction, can be used to measure the temperature at the material. The Wollaston prism is oriented to allow equal power splitting into the two output fibers at the room temperature during the assembly of the sensor head. In implementations, the permanent Faraday rotator may be set at a nominal rotation angle of 45° (x=45°). The rotation angle of the rotator will vary due to the temperature dependence inherent of the permanent Faraday rotator. The temperature induced rotation angle variation will cause the photocurrents detected in PD1 and PD2 to vary, which have the similar to those of Eq. (11)-Eq. (12):

$$I_1 = I_0[1 + \sin 2\theta(T)], \tag{31}$$

$$I_2 = I_0[1 - \sin 2\theta(T)], \tag{32}$$

$$\theta(T) = a(T - T_0) \tag{33}$$

Hence a temperature dependence of the power difference can be obtained and be used to calculate the temperature. The temperature sensor can be co-located with the current sensor in FIG. 1 to detect the temperature at the current sensor for correcting any errors caused by the temperature sensitivity of the Faraday material in the current sensor. The parameters a and $T_0$ of in $\theta(T)$ of a temperature sensor can be obtained for each temperature sensor by putting the sensor in a temperature chamber with different temperature settings. Therefore, the temperature can be obtained using:

$$T = \frac{(I_1 - I_2)}{4a(I_1 + I_2)} + T_0 \tag{34}$$

FIG. 5 discloses a simpler embodiment of the temperature sensor based on the permanent Faraday rotator, in which the Wollaston prism in FIG. 4 is replaced with a polarizer (polarizer 2) and the dual fiber collimator is replaced with a single fiber collimator. Polarizer 2 is oriented either 0° or 90° nominally from polarizer 1. The permanent Faraday rotator can be set at a nominal rotation angle, e.g., in 45° in some implementations. The rotation angle will be varied due to the temperature dependence inherent of the permanent Faraday rotator. The temperature induced rotation angle variation will cause the power detected in PD2 to vary and hence a temperature dependence of the power can be obtained and be used to calculate the temperature. The optional PD1 is used to monitor the power fluctuation of the light source and to remove the effect of the power fluctuation.

The example in FIG. 5 illustrates another design for a current sensor based on optical sensing. Under this design, a current sensor includes a sensor base station including a light source that produces probe light and an optical detection unit including a first optical detector that receives a portion of the probe light of the light source to monitor power fluctuations of the light source and a second optical detector that detects light for sensing a current; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. This optical current sensor head is configured to include an input optical polarizer to filter the probe light to produce a polarized input beam, a Faraday material located to receive and transmit the polarized input beam as a modified optical beam, and an output optical polarizer that receives the modified optical beam from the Faraday material and selectively receives a portion of the modified optical beam as an output beam of the optical current sensor head. The current sensor based on optical sensing includes a single return fiber line having a first fiber line terminal coupled to the optical current sensor head to receive output beam and a second fiber line terminal coupled to the optical detection unit of the sensor base station to deliver the output beam from the optical current sensor to the second optical detector inside the optical detection unit. The optical current sensor head is located near or at a current-carrying conductor so that a magnetic field associated with the current is present at the Faraday material and the second optical detector in the optical detection unit detects the output beam to determine a magnitude of the current.

FIG. 6 illustrates a first embodiment of combining a current sensor head and a temperature sensor head into a same package. A 10% coupler may be used to direct a small portion of the light into the temperature sensor head as the light source.

FIG. 7 illustrates a second embodiment of combining a current sensor head and a temperature sensor head into a same package. The temperature sensing permanent Faraday rotator is oriented 90 degrees from the current sensing Faraday rotator so that the magnetic field induced by the conductor current has no effect on the permanent Faraday rotator even without magnetic shield around the permanent Faraday rotator.

In both FIGS. 6 and 7, the combination of current and the temperature sensors allow the temperature measurement by the temperature sensor output to be used for compensate for the temperature dependency in the current measurement obtained by the current sensor since the polarization rotation in the Faraday material in the current sensor varies with the temperature. This temperature-calibrated measurement can be performed by the sensor base station where the effect of the temperature-induced polarization rotation of the probe light in the Faraday material for current sensing is calibrated by the effect of the temperature-induced polarization rotation measured in the other Faraday material for measuring the temperature. The sensor base station is structured to use a temperature measurement by the third optical detector to compensate for a temperature-induced effect to the measurement of the current. In these configurations, the current sensor and temperature sensor are separated from one another and operate based on separate light beams.

FIG. 8 discloses a transmissive current sensor with built-in temperature sensing capability. Two Faraday rotators are used in this design where a permanent Faraday rotator with a desired amount of polarization rotation as in FIGS. 6 and 7 is configured a temperature sensor and is placed in the front of a second Faraday rotator that is configured as a current sensing Faraday rotator. The current sensor and temperature sensor are optically connected to the same probe light path in series to reduce the structure complexity and to reduce cost of the device. The DC portion of the output optical signal from the sensor head is proportional to the temperature values while the AC portion is proportional to current values, assuming the current to be sensed is an AC current. A Wollaston prism is used to separate the two orthogonal polarization components into two separate fibers. The polarizer is oriented x+45 degrees from the Wollaston prism to allow 50% splitting when no magnetic field applied. A balanced detector in FIG. 3 can be used to receive the detected optical power. A magnetic shield may be used around the permanent Faraday rotator to prevent the influence of the current to be sensed to affect the temperature sensing. Any other material with temperature induced polarization change, such as a waveplate can also be used in the place of the permanent Faraday rotator for sensing the temperature. The photocurrents received in PD1 and PD2 can also be expressed with Eqs. (11) and (12) or Eqs. (18) and (19), where the rotation bias $\theta_0(T)$ in Eq. (24) is adjusted to be 0 at room temperature by optical alignment during the assembly process (corresponding to equal splitting of the powers in two output fibers). When temperature deviate from the room temperature, $\theta_0(T)$ will change and may follow a polynomial relation:

$$\theta_0(T) = a(T-T_0) + b(T-T_0)^2 + c(T-T_0)^3 \tag{35}$$

where the coefficients a, b, and c can be obtained during a calibration process by changing the environment temperature of the sensor in the absence of any magnetic field (no conductor current). In fact, a linear relationship is expected for ideal cases and the coefficients b and c are expected to be negligible.

When the power generation and distribution system is in normal operation, the currents in the system are AC currents and no DC current is expected in the conductor. The parameter $\gamma$ is solely determined by $\theta_0(T)$ from Eq. (17):

$$\gamma(T) = \theta_0(T) \tag{36}$$

Therefore when $\gamma(T)$ is obtained using Eqs (23) and (22) iteratively as described previously, $\theta_0(T)$ is automatically obtained, and the corresponding temperature can be obtained using Eq. (31). When the temperature is known, the correct Verdet constant at the temperature can be used and the accurate conductor current can be obtained when $\beta(T) j_{ac} = V_d(T) L j_{ac}$ is obtained using Eqs. (23) and (22) iteratively. Because the malfunctioning of power system occurs very fast, the DC component of the conductor current may have a sudden jump, resulting a sudden increase in $\gamma(T)$ following Eq. (17): $\gamma(T) = \theta_0(T) + \beta(T) j_{dc}$. In the mean time, the AC component may also have a sudden jump. In the calculation, the temperature T just before the sudden current increase can be used to calculate both the DC and the AC current.

When the power system operates normally, the current in the conductor is a perfect sinusoidal function and the harmonics detected by the current sensor follow Eqs. (22)-(25). However, when the system operates abnormally, such relationship will break down. Therefore, the harmonics of the detected signal can be analyzed to obtain the waveform information of the conductor current. Of cause, the instant waveform of the conductor current can be obtained with Eq. (20) without Fourier transform.

FIG. 1 and FIG. 4 show examples where at least 3 fibers are used to connect the signal processing unit containing the light source and the PD, and the sensor head which is free of electronic components and optical detectors. It is beneficial to reduce the number of fibers for reducing the cost and the wiring complexity of the system during installation. This can be accomplished by, for example, using an optical reflection design in the current sensor head to reflect the probe light to retrace its own path in generating the returned light towards the base station for optical sensing.

Such a current sensor based on optical sensing with the above optical reflection design in the current sensor head can include a sensor base station including a light source that produces probe light, a first optical detector that receives a portion of the probe light of the light source to monitor power fluctuations of the light source and a second optical detector that detects light for sensing a current; an output fiber line having a first fiber line terminal coupled to the sensor base station to receive the probe light from the light source and to direct the received probe light to a second fiber line terminal of the output fiber line away from the sensor base station; and an optical current sensor head coupled to the second fiber line terminal of the output fiber line to receive the probe light. The optical current sensor head is configured to include an input optical polarizer to filter the probe light to produce a polarized beam, a polarization beam splitter that selectively outputs a first part of the polarized beam in a first polarization, a Faraday material located to receive and transmit the first part of the polarized beam in the first polarization as a modified optical beam, a polarizer to transmit the modified optical beam and a mirror to reflect the modified optical beam back to the polarizer, the Faraday material and the PBS which outputs the reflected modified optical beam as an output beam separated from the probe light received by the optical current sensor head. The current sensor based on optical sensing includes a return fiber line having a first fiber line terminal coupled to the optical current sensor head to receive the output beam to deliver the output beam from the optical current sensor to the second optical detector in the sensor base station. The optical current sensor head is located near or at a current-carrying conductor so that a magnetic field associated with the current is present at the Faraday material and the second optical detector detects the output beam to determine a magnitude of the current.

FIG. 9 discloses a first embodiment of a reflective current sensor head, in which the polarizer is oriented 45 degrees from the PBS passing axis so that the reflected light from the mirror is split 50% by the PBS into two separate fibers at zero magnetic field. At the signal processing side, a circulator or a coupler can be used to separate to forward and backward going light of the first fiber. Fiber 1 can be a polarization maintaining fiber (PM), a single mode fiber (SM), or a multimode fiber (MM). If a more expensive polarization maintaining (PM) fiber is used, a light source with high DOP can be used and the polarization axis must be aligned with the slow (or fast) axis of the PM fiber. For the case of using a low DOP source, there is no requirement of the orientation of the PBS with respect to the input light. On the other hand, for the case of PM fiber, the PBS's passing axis should be aligned with the slow (or fast) axis of the PM fiber.

FIG. 10 discloses a second embodiment of a reflective current sensor head with an integrated temperature sensing capability. The PBS splits a certain percentage of light into the temperature sensing branch, which consists of a permanent Faraday rotator, a reflecting prism or mirror, and a collimator (collimator 3), and a fiber to sending temperature related information to the remote signal processing unit. When SM or MM fiber is used as Fiber 1, low DOP source should be used and the PBS split 50% into the temperature sensing branch. When PM fiber is used as fiber 1, the slow axis of the PM fiber is aligned x° to the passing axis of the PBS to split a certain percentage of the incoming light into the temperature sensing branch.

FIG. 11 illustrates a $3^{rd}$ embodiment of a reflective current sensor. The polarizer is oriented 45 degrees from the Wollaston prism passing axis so that the reflected light is split 50% by the prism into two separate fibers at zero magnetic field. If PM fiber is used, the slow axis (or fast axis) should be aligned with the passing axis of the Wollaston prism. If SM or MM fiber is used, low DOP light source must be used to minimize the polarization sensitivity of the sensor system.

FIG. 12 illustrates a $4^{th}$ embodiment of a reflective current sensor head with an integrated temperature sensor. A permanent Faraday rotator is placed before the current sensing Faraday rotator with a rotation angle of x° at room temperature and is shielded from magnetic field. The polarizer is oriented 45°+x° to allow equal power splitting of the reflected light into the two fibers. When the temperature changes, the power difference between the two fibers changes and such a change can be used to sense the temperature, similar the situation of FIG. 8.

FIG. 13 illustrates a current sensing system for simultaneously monitoring currents in three conductors in a 3-phase power system. A temperature monitoring channel is also included to monitor the instantaneous temperature to compensate the temperature dependence of the Verdet constant of the Faraday rotators used in the current sensing heads. In particular, the Verdet constant at different temperatures are stored in a look-up table of the digital circuit. When a temperature is obtained from the temperature sensor, the corresponding Verdet constant is located in the look-up table, which will be used for the electrical current calculation. Note that a single light source is shared by four sensing channels to reduce the total cost.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document and attached appendices.

What is claimed is:

1. A current and temperature sensor based on optical sensing, comprising:
  a sensor base station including a light source that produces probe light and an optical detection unit;
  an output fiber line having a first fiber line terminal coupled to the sensor base station to receive the probe light from the light source and to direct the received probe light to a second fiber line terminal of the output fiber line away from the sensor base station;
  an optical sensor head coupled to the second fiber line terminal of the output fiber line to receive the probe light and configured to include an input optical polarizer to filter the probe light to produce a polarized input beam, a first Faraday material located to receive and transmit the polarized input beam as a first modified optical beam and a second Faraday material to receive and transmit the first modified optical beam as a second modified optical beam, and an optical polarization separation device that receives the second modified optical beam from the second Faraday material and splits the second modified optical beam into first and second beams in two different polarizations along first and second optical paths, respectively,
wherein the first Faraday material is configured to provide a fixed change in polarization dependent on temperature and the second Faraday material is configured to provide a change in polarization dependent on a magnetic field associated with an alternating current (AC) carrying conductor;
a first return fiber line having a first fiber line terminal coupled to the optical sensor head to receive the first beam and a second fiber line terminal coupled to the optical detection unit of the sensor base station to deliver the first beam from the optical sensor to the optical detection unit; and
a second return fiber line having a first fiber line terminal coupled to the optical sensor head to receive the second beam and a second fiber line terminal coupled to the optical detection unit of the sensor base station to deliver the second beam from the optical sensor to the optical detection unit,
wherein the optical sensor head is located in a space at a temperature so that a direct current (DC) portion of a change in polarization due to the first Faraday material is associated with the temperature and the optical detection unit detects the two optical beams to determine the temperature, and
wherein the optical sensor head is located near or at the alternating current carrying conductor so that the magnetic field associated with the alternating current is present at the second Faraday material and the optical detection unit detects the two optical beams to determine a magnitude of the alternating current.

2. The current and temperature sensor of claim 1, wherein the first Faraday material is replaced with a temperature sensitive polarization material.

3. The current and temperature sensor of claim 2, wherein the temperature sensitive polarization material is a waveplate.

4. The current and temperature sensor of claim 1, wherein the first Faraday material is rotated during an assembly of the current and temperature sensor to cause zero degrees of polarization rotation at a standard room temperature.

5. The current and temperature sensor of claim 1, wherein a polarization rotation of the first Faraday material may be approximated as a linear function of the difference between a current temperature and a standard room temperature.

6. The current and temperature sensor of claim 1, wherein a polarization rotation of the first Faraday material may be approximated as a polynomial function of a difference between a current temperature and a standard room temperature.

7. The current and temperature sensor of claim 1, wherein the optical polarization separation device includes a Wollaston prism.

8. The current and temperature sensor of claim 1, wherein the output fiber line includes a polarization maintaining fiber segment.

9. The current and temperature sensor of claim 1, wherein the output fiber line includes a single mode fiber segment.

10. The current and temperature sensor of claim 1, wherein the output fiber line includes a multimode fiber segment.

11. A current and temperature sensor, comprising:
a sensor base station including a light source that produces probe light and an optical detection unit;
an output fiber line having a first fiber line terminal coupled to the sensor base station to receive the probe light from the light source and to direct the received probe light to a second fiber line terminal of the output fiber line away from the sensor base station;
an optical sensor head coupled to the second fiber line terminal of the output fiber line to receive the probe light, the optical sensor head including:
an optical beam splitter to split the probe light into a current sensing beam and a temperature sensing beam,
a first Faraday material located to receive and transmit the current sensing beam as a first modified optical beam, wherein the first Faraday material is located near or at a current carrying conductor so that a magnetic field associated with the current is present at the first Faraday material,
an optical polarization separation device that receives the first modified optical beam from the first Faraday material and splits the first modified optical beam into a first polarization and a second polarization along first and second optical paths, wherein the optical detection unit detects the first and second polarizations to determine a magnitude of the current,
a second Faraday material located to receive and transmit the temperature sensing beam as a second modified optical beam, wherein the second Faraday material is located to sense a temperature, and wherein the second Faraday material is oriented with respect to the first Faraday material to prevent the current carrying conductor from affecting a polarization rotation by the second Faraday material due to the temperature, wherein the optical detection unit detects the second modified optical beam to determine a temperature;
a first return fiber line coupled between the optical sensor head and the sensor base station to direct the first polarization of the first modified beam out of the optical sensor head to the sensor base station;
a second return fiber line coupled between the optical sensor head and the sensor base station to direct the second polarization of the first modified beam out of the optical sensor head to the sensor base station; and
a third return fiber line coupled between the optical sensor head and the sensor base station to direct the second modified beam out of the optical sensor head to the sensor base station,
wherein the optical detection unit includes:
a first optical detector that detects the first polarization and a second optical detector that detects the second polarization to produce detector outputs representative of the current and a third optical detector that detects the second modified beam to produce another detector output representative of the temperature.

12. The current and temperature sensor of claim 11, wherein the second Faraday material is replaced with a temperature sensitive polarization material.

13. The current and temperature sensor of claim 12, wherein the temperature sensitive polarization material is a waveplate.

14. The current and temperature sensor of claim 11, wherein the second Faraday material is rotated during an assembly of the current and temperature sensor to cause zero degrees of polarization rotation at a standard room temperature.

15. The current and temperature sensor of claim 11, wherein a polarization rotation of the second Faraday material may be approximated as a linear function of the difference between a current temperature and a standard room temperature.

16. The current and temperature sensor of claim 11, wherein a polarization rotation of the second Faraday material may be approximated as a polynomial function of the difference between a current temperature and a standard room temperature.

17. The current and temperature sensor of claim 11, wherein the optical polarization separation device includes a Wollaston prism.

18. The current and temperature sensor of claim 11, wherein the output fiber line includes a polarization maintaining fiber segment.

19. The current and temperature sensor of claim 11, wherein the output fiber line includes a single mode fiber segment.

20. The current and temperature sensor of claim 11, wherein the output fiber line includes a multimode fiber segment.

* * * * *